US005708402A

United States Patent [19]

Hachisu et al.

[11] Patent Number: 5,708,402

[45] Date of Patent: Jan. 13, 1998

[54] SURFACE ACOUSTIC WAVE DEVICE IMPROVED IN CONVOLUTION EFFICIENCY, RECEIVER USING IT, COMMUNICATION SYSTEM USING IT, AND METHOD FOR PRODUCING SURFACE ACOUSTIC WAVE DEVICE IMPROVED IN CONVOLUTING EFFICIENCY

[75] Inventors: Takahiro Hachisu; Norihiro Mochizuki, both of Yokohama; Koichi Egara, Tokyo; Tadashi Eguchi, Kawasaki; Akihiro Koyama; Akane Yokota, both of Yokohama, all of Japan

[73] Assignee: Canon Kabushiki Kaisha, Tokyo, Japan

[21] Appl. No.: 534,174

[22] Filed: Sep. 26, 1995

[30] Foreign Application Priority Data

Sep. 28, 1994 [JP] Japan .................................... 6-232849

[51] Int. Cl.$^{6}$ ........................................................ H03H 9/64

[52] U.S. Cl. ..................... 333/133; 310/313 R; 375/219; 333/193

[58] Field of Search .................................... 333/193–196, 333/133; 310/313 R, 313 A, 313 B, 367; 375/219

[56] References Cited

U.S. PATENT DOCUMENTS

| | | | |
|---|---|---|---|
| 4,012,650 | 3/1977 | Pratt et al. | 333/194 |
| 4,163,201 | 7/1979 | Takahashi et al. | 333/194 |
| 4,598,261 | 7/1986 | Ballato | 333/196 |
| 5,164,628 | 11/1992 | Egara et al. | 310/313 |
| 5,200,663 | 4/1993 | Mochizuki et al. | 310/313 |
| 5,353,304 | 10/1994 | Mochizuki | 375/1 |
| 5,367,216 | 11/1994 | Egara et al. | 310/313 |

FOREIGN PATENT DOCUMENTS

| | | |
|---|---|---|
| A-3729014 | 3/1989 | Germany . |
| 52-028838 | 3/1977 | Japan . |
| 53-68053 | 6/1978 | Japan . |
| 56-043819 | 4/1981 | Japan . |
| 56-43819 | 4/1981 | Japan . |
| 012098110 | 8/1989 | Japan . |
| 1209811 | 8/1989 | Japan . |
| 02179108 | 7/1990 | Japan . |
| 02179110 | 7/1990 | Japan . |
| 03165116 | 7/1991 | Japan . |
| A-03165115 | 7/1991 | Japan . |
| WO-A-9202094 | 2/1992 | WIPO . |

OTHER PUBLICATIONS

*Patent Abstracts of Japan,* vol. 015, No. 405 (E–1122), Oct. 1991.

"Surface–acoustic–wave plate convolvers at 1 GHz", Colvin, et al., *Applied Physics Letters,* vol. 35, No. 7, Oct. 1, 1979.

*Primary Examiner*—Benny Lee
*Assistant Examiner*—Darius Gambino
*Attorney, Agent, or Firm*—Fitzpatrick, Cella, Harper & Scinto

[57] ABSTRACT

A surface acoustic wave device includes a substrate having piezoelectricity, at least two input electrodes, provided on the substrate, for exciting first and second surface acoustic waves, and an output electrode for taking a convolution signal of the two surface acoustic waves out. The substrate has a roughness configuration on a back face thereof and a maximum depth of the roughness configuration is not less than a wavelength of bulk waves of convolution output taken out of the output electrode.

13 Claims, 10 Drawing Sheets

FIG. 7

| GRIT | MEAN DIAMETER OF MAXIMUM PARTICLE (μ) | MEAN DIAMETER OF THE 30th PARTICLE FROM MAXIMUM PARTICLE (μ) | AVERAGE OF MEAN DIAMETER (μ) |
|---|---|---|---|
| # 240 | 171 OR LESS | 120 OR LESS | 87.5 TO 73.5 |
| # 280 | 147 OR LESS | 101 OR LESS | 73.5 TO 62 |
| # 320 | 126 OR LESS | 85 OR LESS | 62 TO 52.5 |
| # 360 | 108 OR LESS | 71 OR LESS | 52.5 TO 44 |
| # 400 | 92 OR LESS | 60 OR LESS | 44 TO 37 |
| # 500 | 80 OR LESS | 52 OR LESS | 37 TO 31 |
| # 600 | 70 OR LESS | 45 OR LESS | 31 TO 26 |
| # 700 | 61 OR LESS | 39 OR LESS | 26 TO 22 |
| # 800 | 53 OR LESS | 34 OR LESS | 22 TO 18 |
| # 1000 | 44 OR LESS | 29 OR LESS | 18 TO 14.5 |
| # 1200 | 37 OR LESS | 24 OR LESS | 14.5 TO 11.5 |
| # 1500 | 31 OR LESS | 20 OR LESS | 11.5 TO 8.9 |
| # 2000 | 26 OR LESS | 17 OR LESS | 8.9 TO 7.1 |
| # 2500 | 22 OR LESS | 14 OR LESS | 7.1 TO 5.9 |
| # 3000 | 19 OR LESS | 12 OR LESS | 5.9 TO 4.7 |

| GRINT NUMBER OF ABRADANT [#] | 197 | 240 | 320 |
|---|---|---|---|
| MAXIMUM DEPTH OF ROUGHNESS CONFIGURATION [μm] ‖ WAVELENGTH OF BULK WAVE OF CONVOLUTION OUTPUT [μm] | 140 | 84 | 40 |
| FREQUENCY OF CONVOLUTION OUTPUT [MHz] | 40 | 70 | 150 |
| INPUT CENTRAL FRQUENCY [MHz] | 20 | 35 | 75 |

SURFACE ACOUSTIC WAVE DEVICE IMPROVED IN CONVOLUTION EFFICIENCY, RECEIVER USING IT, COMMUNICATION SYSTEM USING IT, AND METHOD FOR PRODUCING SURFACE ACOUSTIC WAVE DEVICE IMPROVED IN CONVOLUTING EFFICIENCY

BACKGROUND OF THE INVENTION

1. Field of the Invention

The present invention relates to a surface acoustic wave convolver for picking up an output signal of convolution between two input signals, utilizing a physical nonlinear effect of a substrate having piezoelectricity.

2. Related Background Art

Presently, there are a variety of applications and studies of surface acoustic wave (SAW) devices, among which the SAW convolver is increasing its significance as a key device for spread spectrum (SS) communication, which is drawing attention as next-generation communication technology.

FIG. 1 is a schematic diagram to show a conventional SAW convolver.

In the drawing, reference numeral 1 designates a piezoelectric substrate such as Y-cut (Z-propagation) lithium niobate, 2 comb-shape input electrodes (IDT: interdigital transducers) formed on the surface of the piezoelectric substrate 1, and 3 an output electrode formed on the surface of the piezoelectric substrate 1.

These electrodes are made of an electrically conductive material such as aluminum, and normally are formed directly on the surface of the piezoelectric substrate 1 by the photolithography techniques.

In the SAW device constructed in the above structure, surface acoustic waves are excited by the piezoelectric effect of the substrate when an electric signal of carrier angular frequency $\omega$ is input into the two interdigital transducers 2.

These two surface acoustic waves propagate in mutually opposite directions on the piezoelectric device 1 as confined in the output electrode under an action of the output electrode 3 as a waveguide.

Running against each other on the output electrode 3 in this manner, the two surface acoustic waves are subject to the physical nonlinear effect of the piezoelectric substrate 1 to be taken as a convolution signal (of carrier angular frequency $2\omega$) of the two input signals out of the output electrode 3.

Let us suppose the two surface acoustic waves are expressed as follows.

$$F(t-x/v)e^{j(\omega t-kx)} \text{ and } G(t+x/v)e^{j(\omega t+kx)}$$

In the piezoelectric substrate 1 the nonlinear interaction produces the surface acoustic wave defined by the following product of the above two waves.

$$F(t-x/v)e^{j(\omega t-kx)}\cdot G(t+x/v)e^{j(\omega t+kx)}$$

Providing a uniform output electrode, this signal can be taken out as a signal expressed by integration of the product over a region L of the length of the output electrode.

$$H(t)=Ke^{2j\omega t}\int_{-L/2}^{L/2}F\left(t-\frac{x}{v}\right)\cdot G\left(t+\frac{x}{v}\right)dx \tag{1}$$

Here, the integration range L can be taken substantially as $\pm\infty$ if the length of interaction is sufficiently greater than the signal length. Putting $\tau=t-v/x$ into Eq. (1), Eq. (1) turns to Eq. (2) as follows, and the signal becomes convolution of the two input signals.

$$H(t)=-vKe^{2j\omega t}\int_{-\infty}^{\infty}F(\tau)\cdot G(2t-\tau)d\tau \tag{2}$$

As seen from above Eq. (2), the above convolution output signal is independent of the location in the surface of output electrode, and exists on a uniform basis. Thus, oscillation occurs in the direction of the thickness of the piezoelectric substrate 1. Then, bulk acoustic waves (or bulk waves) of the convolution signal having the frequency of the double of the frequency of the input signals are reflected by the back face of the piezoelectric substrate 1 and are taken out of the output electrode 3 as superimposed on the convolution output signal.

FIG. 2 shows a graph of frequency characteristics of the convolution output signal when the back face of the piezoelectric substrate is mirror-finished. As indicated in the graph, because the bulk waves of the convolution output appearing in the thickness direction of the piezoelectric device are superimposed on the output signal of the object signal, spurious components appear, which is a cause to considerably narrow the band of the output signal.

The SAW convolver as described above is one of SAW devices, and waves appearing therein include not only the surface acoustic waves such as Rayleigh waves, but also a longitudinal wave and a transverse wave excited into an elastic body. Normally, these waves excited into the elastic body are generally called as bulk waves.

As a means for suppressing such bulk waves there are various means and conditions proposed in patent applications, for example in Japanese Laid-open Patent Application No. 2-179110, No. 2-179108, No. 1-209811, No. 56-43819, No. 52-28838, and No. 3-165116.

Meanwhile, the above bulk waves can be classified under two types because of a difference of characteristics thereof.

The first one includes those which are first generated on the interdigital input electrode in a SAW device such as a SAW filter, then are reflected by the back face of the piezoelectric substrate, propagate into the interdigital output electrode, and are taken out in the form included in the output signal from the output electrode.

Conventionally, generation of this type of bulk waves is suppressed by roughening the back surface of the piezoelectric substrate by grinding or forming grooves in the back face, and various conditions therefor are proposed in patent applications. Particularly, the effect of suppression greatly changes depending upon factors, such as the operating frequency determined by the interdigital electrodes of SAW device, the thickness of the piezoelectric substrate, and the depth, width, and pitch of roughness formed on the back face.

The second one includes those obtained in such a manner that when like the SAW convolver among the SAW devices the surface acoustic waves excited in the two interdigital input electrodes are taken out as a convolution signal from the output electrode of convolver, bulk waves of the convolution signal having a frequency equal to a sum of frequencies of the two input signals are reflected by the back face of the piezoelectric substrate and then return to the output electrode to be taken out together with the convolution output signal.

A conventional means for suppressing such bulk waves of the convolution output is an arrangement of grooves formed on the back face of the piezoelectric substrate, by which phases are shifted from each other by a half wavelength between those reflected by recessed portions on the back face of the piezoelectric substrate and those reflected by projected portions on the back face of the piezoelectric substrate when the bulk waves of the convolution output generated in the output electrode impinge on the back face, so as to cancel each other, thereby preventing generation of the bulk waves of the convolution output which could be detected at the same time as the convolution signal in the output electrode.

The above two types of bulk waves both were causes of spurious response, which degraded the characteristics of SAW devices.

The above mechanism of convolution and bulk waves is described in detail, for example, in "Handbook of Surface Acoustic Wave Device Technology," compiled by the 150th committee of acoustic wave device technology of Japan Society for the Promotion of Science, OHM Sha, (1991), pp 145–205, pp 371–374.

There are, however, some problems to be solved in the method for suppressing the bulk waves of the convolution output generated in the thickness direction of the piezoelectric substrate and taken out of the output electrode in the SAW convolver.

Because of easiness of processing, various methods and means are proposed in patent applications as to the method for attenuating the bulk waves by roughening the back face of the piezoelectric substrate by means of grinding and thereby diffusely reflecting (or scattering) the bulk waves in order to suppress the bulk waves generated from the interdigital input electrode. They all concern the bulk waves generated from the interdigital input electrode, but do not concern the bulk waves of the convolution output generated from the output electrode of convolver.

Incidentally, since in the SAW convolver the convolution output signal component has the frequency which is the double of the carrier angular frequency ω of SAWs excited in the interdigital input electrodes, it is rarely affected by the bulk waves generated by the interdigital input electrodes.

Even in the applications of the method for grinding the back face of the piezoelectric substrate to the SAW filter, none shows a definite relation between the bulk waves generated from the interdigital electrode of SAW device and the configuration of the back face of the piezoelectric substrate. Thus, many patents inevitably disclose techniques concerning the conditions resulting from empirical values, and need to rely on a cut-and-try method, which raises a problem of reproducibility of the effect.

The method for eliminating influence of the bulk waves of the convolution output generated on the output electrode by forming the grooves at a pitch according to the central frequency used in the convolver on the back face of the piezoelectric substrate and shifting the phase of bulk waves of the convolution output reflected on the recessed portions of grooves on the back end face by a half wavelength relative to the phase of those reflected on the projected portions of grooves on the back end face, had such a drawback that the method for forming the grooves took much more time than the above processing method by grinding.

At the same time, because the phases of bulk waves of the convolution output reflected by the back face of the substrate greatly depend upon accuracy of the grooves formed in this method, there occurs a problem of reproducibility of the effect.

SUMMARY OF THE INVENTION

An object of the present invention is to achieve a SAW device capable of easily, surely and efficiently suppressing the bulk waves of the convolution output contained in the convolution output signal extracted at the output electrode, eliminating influence of the nonlinear bulk waves, and thereby obtaining the convolution output signal without spurious component, by showing a definite relation between the wavelengths of bulk waves of the convolution output and the configuration of roughness of the back face of the piezoelectric substrate, derived from the central frequency of the interdigital input electrodes used in the SAW convolver device.

In an aspect of the present invention, a surface acoustic wave device comprises:

a substrate having piezoelectricity;

at least two input electrodes, provided on the substrate, for exciting first and second surface acoustic waves; and an output electrode for taking a convolution signal of the two surface acoustic waves out;

wherein the substrate has a roughness configuration on a back face thereof and a maximum depth of the roughness configuration is not less than a wavelength of bulk waves of convolution output taken out of the output electrode.

In another aspect, the roughness configuration is so arranged that a maximum value out of values except for a dc component in a spatial Fourier transform of the configuration is not less than a wavelength of bulk waves of convolution output taken out of the output electrode.

In still another aspect, the roughness configuration is formed by grinding the back face with an abradant of a grit number N satisfying the following relation:

$$N \leq \sqrt[2.6]{\frac{1.3 \times 10^8}{\lambda_B}}$$

where $\lambda_B$ is a wavelength of bulk waves of convolution output taken out of the output electrode.

In a preferred embodiment of the above surface acoustic wave device, a width of the roughness configuration is not less than the wavelength of the bulk waves of convolution output but not more than a length of the output electrode.

In another preferred embodiment of the above surface acoustic wave device, Y-cut lithium niobate is used for the substrate having piezoelectricity.

A method for producing the surface acoustic wave device has a step of forming the roughness configuration on the back face of the substrate so that a maximum depth of the roughness configuration is not less than a wavelength of bulk waves of convolution output taken out of the output electrode.

Another method for producing the surface acoustic wave device has a step of forming the roughness configuration on the back face of the substrate, wherein the roughness configuration is so arranged that a maximum value out of values except for a dc component in a spatial Fourier transform of the configuration is not less than a wavelength of bulk waves of convolution output taken out of the output electrode.

Another method for producing the surface acoustic wave device has a step of grinding a back face of the substrate with an abradant, wherein the grinding is carried out using the abradant of a grit number N satisfying the following relation:

$$N \leq \sqrt[2.6]{\frac{1.3 \times 10^8}{\lambda_B}}$$

where $\lambda_B$ is a wavelength of bulk waves of convolution output taken out of the output electrode.

A receiver for receiving a spread spectrum signal comprises either one of the surface acoustic wave devices as described above, for obtaining a correlation output between a spread code signal and a reference spread code signal input thereinto.

A communication system for communication using a spread spectrum signal, comprises:

a transmitter for spectrum-spreading a signal to be transmitted and outputting a spread spectrum signal; and the receiver for receiving the spread spectrum signal.

According to the present invention, the roughness configuration, calculated using the central frequency of the bulk waves of the convolution output generated by the SAW convolver, is formed by the method of grinding or the like on the back face of the piezoelectric substrate, thereby suppressing the bulk waves of convolution output generated from the output electrode of the SAW convolver so as to eliminate the spurious components in the convolution output signal, and thus improving the characteristics including the convolution efficiency and band.

Further, according to the present invention, the definite relationship was established between the wavelength of the bulk waves of convolution output and the configuration of roughness of the back face of the piezoelectric substrate, derived from the central frequency of the interdigital input electrodes used in the SAW convolver device, thereby easily, surely, and efficiently suppressing the bulk waves of convolution output contained in the convolution output signal extracted from the output electrode, thus eliminating the influence of the nonlinear bulk waves, and achieving the SAW device capable of obtaining the convolution output signal without spurious component with good reproducibility.

BRIEF DESCRIPTION OF THE DRAWINGS

FIG. 7 is a drawing to show a relation between grit of abradant and mean diameter of particles (transcribed partially from Japanese Industrial Standard JIS R6001);

DESCRIPTION OF THE PREFERRED EMBODIMENTS

Embodiments of the present invention will be explained.

Figure 3:
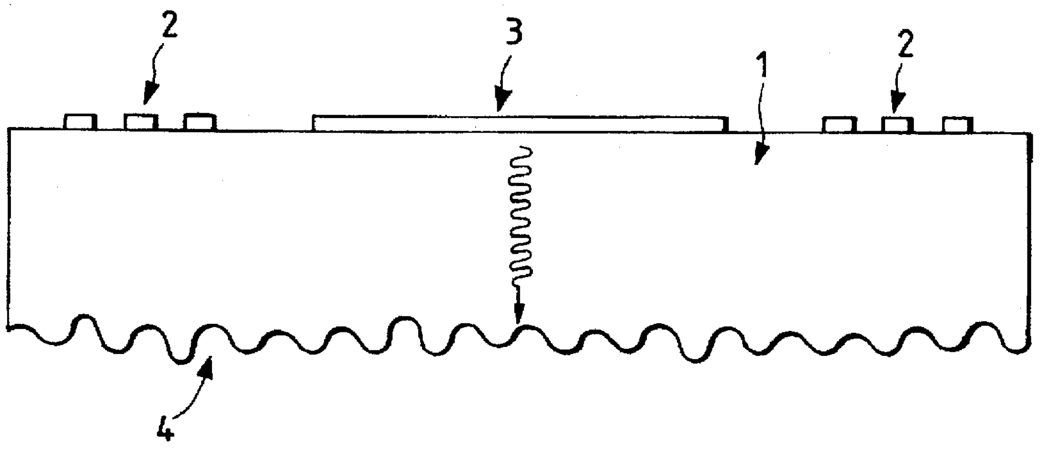
FIG. 3 is a schematic diagram to show a first embodiment of the SAW convolver according to the present invention.

FIG. 3 is a schematic diagram to show the first embodiment of the SAW convolver according to the present invention.

In the drawing, reference numeral 1 denotes a Y-cut (Z-propagation) lithium niobate piezoelectric substrate, 2 interdigital input electrodes formed on the surface of the piezoelectric substrate 1, 3 an output electrode formed on the surface of the piezoelectric substrate 1, and 4 the configuration of roughness formed on the back face of the piezoelectric substrate 1.

These electrodes are made of an electrically conductive material such as aluminum, and normally are formed directly on the surface of the piezoelectric substrate 1 by the photolithography techniques.

In the SAW device constructed in the above structure, when an electric signal of carrier angular frequency $\omega$ is input into the interdigital input electrodes 2, surface acoustic waves are excited by the piezoelectric effect of substrate to propagate in mutually opposite directions on the piezoelectric substrate 1 as confined in the output electrode (waveguide) under an action of the output electrode 3 as a $\Delta V/V$ waveguide. Then the two waves run against each other on the output electrode 3 and a convolution signal of $2\omega$ is taken out of the output electrode 3 by the physical nonlinear effect of the piezoelectric substrate 1.

Here, the $\Delta V/V$ waveguide electrically short-circuits the surface of substrate so as to decrease the propagation velocity of surface acoustic waves to a level lower than that on the free surface, thereby confining the surface acoustic waves in the short-circuited portion. Since in the output electrode 3 the convolution output signal exists uniform at this time independently of a place in the electrode surface, bulk waves of wavelength $\lambda_B$ are generated at angular frequency of 2ω in the thickness direction of the piezoelectric substrate 1, and propagate toward the back face of the piezoelectric substrate 1.

Here, the back face of the piezoelectric substrate is ground by an abradant having a certain specific grit, so that the configuration of roughness is formed on the back face. The bulk waves of convolution output generated from the output electrode 3 are diffusely reflected by the back face of the substrate, thus being well suppressed.

An amount of attenuation of the bulk waves of convolution output is related to the depth and width of the configuration of recesses of the roughness formed on the back face of the substrate, and among them, it greatly depends upon the depth, particularly the maximum depth of recesses in roughness. The maximum depth means a maximum value out of values except for the dc component in a spatial Fourier transform of the roughness configuration of the back face of the piezoelectric substrate.

In this case, diffuse reflection becomes ineffective if the state of the back face looks flat when the back face of substrate is seen from the bulk waves of convolution output. Thus, the depth of recesses in the roughness formed on the back face needs to be equivalent to or more than the wavelength $\lambda_B$ of the bulk waves of convolution output.

Here is described a simple example of the method for obtaining the maximum value out of values except for the dc component from the spatial Fourier transform of the roughness configuration of the back face of the piezoelectric substrate.

Assuming l(x) is a certain spatial periodic function, a spatial Fourier transform thereof is expressed as follows.

$$L(\omega)=\int_{-\infty}^{+\infty} l(x)e^{-j\omega x}dx$$

In this equation, x is a variable indicating the distance.

Out of components of the spatial Fourier transform L(ω), the component at ω=0, that is, L(0), is eliminated because it does not directly affect a spatial change of the periodic function l(x).

Consequently, the statement that "the maximum value out of values except for the dc component in the spatial Fourier transform of the roughness configuration is not less than the wavelength of the bulk waves of convolution output taken out of the output electrode" becomes equivalent to a statement "the maximum value among components L(ω) excluding L(0) at ω=0 in the function L(ω) of the spatial Fourier transform of the spatial periodic function l(x) of the roughness configuration is not less than the wavelength of the bulk waves of convolution output taken out of the output electrode."

In practice, such a roughness configuration can be easily and surely obtained by grinding the back face by an abradant of a specific grit number. Thus, various abradants were used to form the roughness configuration and maximum depths were measured by a measuring instrument, thereby finding a certain fixed relation.

Figure 4:
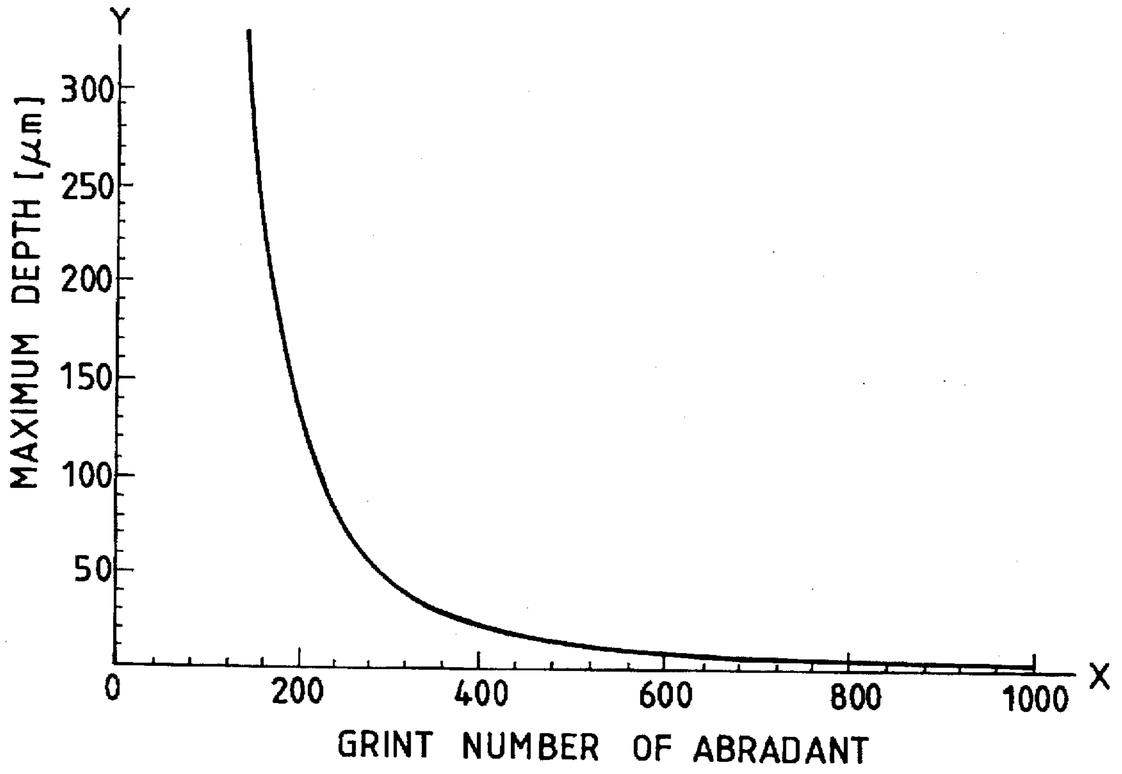
FIG. 4 is a drawing to show a relation between grit number of abradant and maximum depth of recesses in roughness formed thereby on the back face.

FIG. 4 is a graph to show a relationship between the grit number of abradant used for grinding the back face of the piezoelectric substrate and the maximum depth of recesses in the roughness formed thereby.

In the drawing, the abscissa represents the grit number of abradant while the ordinate the maximum depth of recesses in the roughness.

In the drawing, the relation between the grit number of abradant and the maximum depth of recesses in roughness can be expressed by the following function with the abscissa being X and the ordinate being Y [μm].

$$Y=1.3\times10^{8}\cdot X^{-2.6} \tag{3}$$

Let us suppose the wavelength of the bulk waves of convolution output at this time is $\lambda_B$. Then taking this wavelength $\lambda_B$ on the axis of the maximum depth, i.e., on the ordinate, a grit number of abradant at an intersecting point with the curve represented by above Eq. (3) indicates a maximum grit number that can suppress the bulk waves of convolution output, and use of grit numbers of above the maximum number would result in making the maximum depth of the configuration of recesses in roughness formed on the back face smaller than $\lambda_B$, which would in turn result in failing to effect efficient diffuse reflection of bulk waves of convolution output.

Also, as to the widthwise size of the roughness formed on the back face, diffuse reflection becomes ineffective if the state of the back face looks flat when the back face of substrate is seen from the bulk waves of convolution output. Thus, the widthwise size of the roughness needs to be equivalent to or more than the wavelength $\lambda_B$ of the bulk waves of convolution output, and the maximum size is about the length of the output electrode of the SAW convolver.

Here, the width means a length between maximum points (or minimum points) in depth of adjacent recesses or projections.

For example, supposing the piezoelectric substrate used for the SAW convolver is a Y-cut lithium niobate substrate, speeds of the bulk waves of convolution output propagating in the substrate are at the level of about 5500 to 6000 m/s. Assuming 150 MHz for the central frequency of the interdigital electrodes formed on the surface of piezoelectric substrate, the center frequency of the bulk waves of convolution output is the double thereof, 300 MHz, and the wavelength $\lambda_B$ of the bulk waves becomes a value of about 20 μm. Then the maximum grit number is about #400 from this value of $\lambda_B$, using the graph of FIG. 4. Thus, using the grit numbers of not more than #400, the maximum depth of the roughness formed on the back face of substrate can be made greater than the wavelength $\lambda_B$ of the bulk waves of convolution output, whereby the bulk waves can be effectively diffusely reflected and well suppressed.

Figure 5:
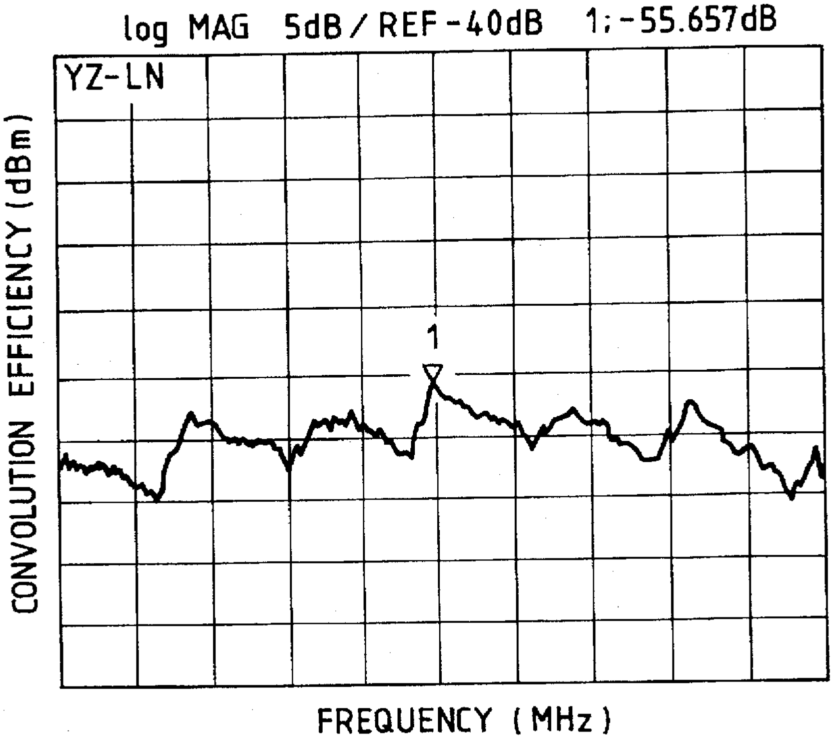
FIG. 5 is a drawing to show frequency characteristics measured of a convolution output signal from the SAW convolver when the back face is ground by grit number #1000 of abradant according to the present invention.
Figure 6:
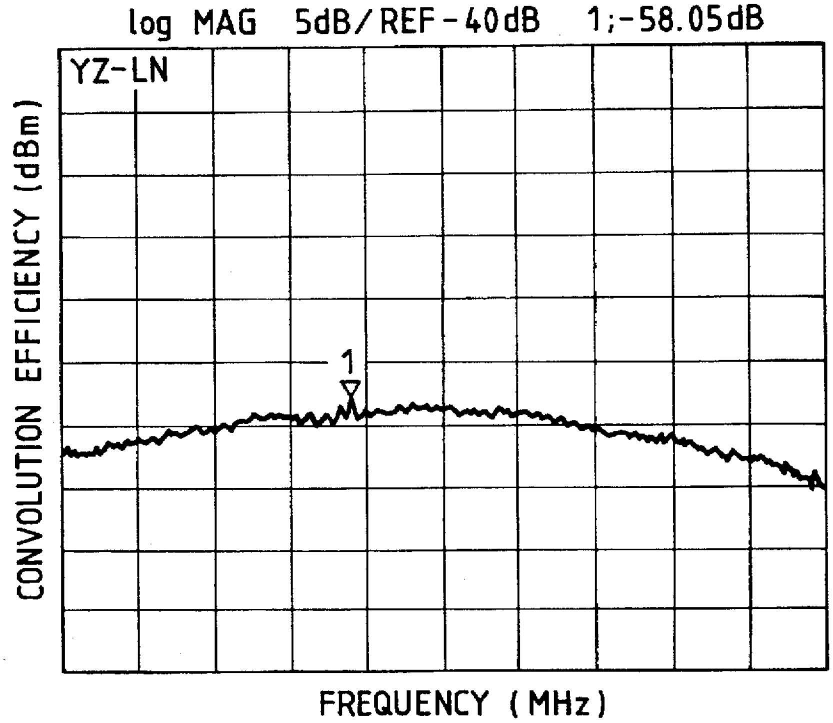
FIG. 6 is a drawing to show frequency characteristics measured of a convolution output signal from the SAW convolver when the back face is ground by grit number #240 of abradant according to the present invention.

FIG. 5 and FIG. 6 are graphs of frequency characteristics measured for convolution output signals from SAW convolvers where the back face of the piezoelectric substrate was ground by respective grit numbers #1000 and #240 of abradant.

Figure 1:
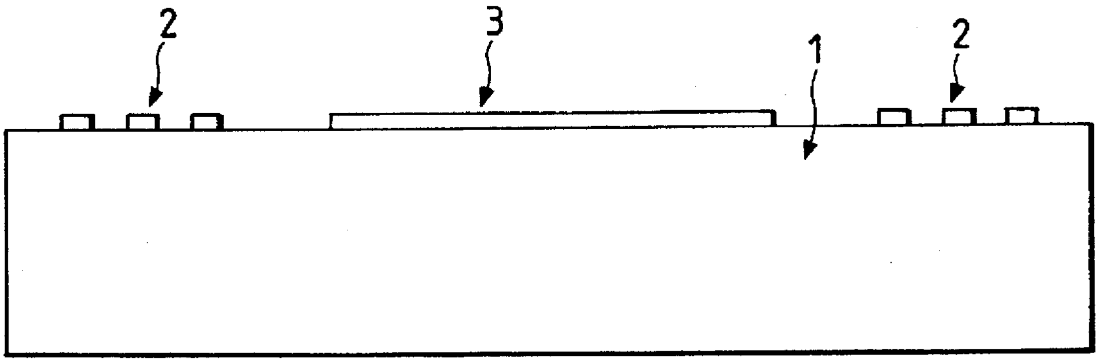
FIG. 1 PRIOR ART
FIG. 1 is a schematic diagram to show a conventional SAW convolver.
Figure 2:
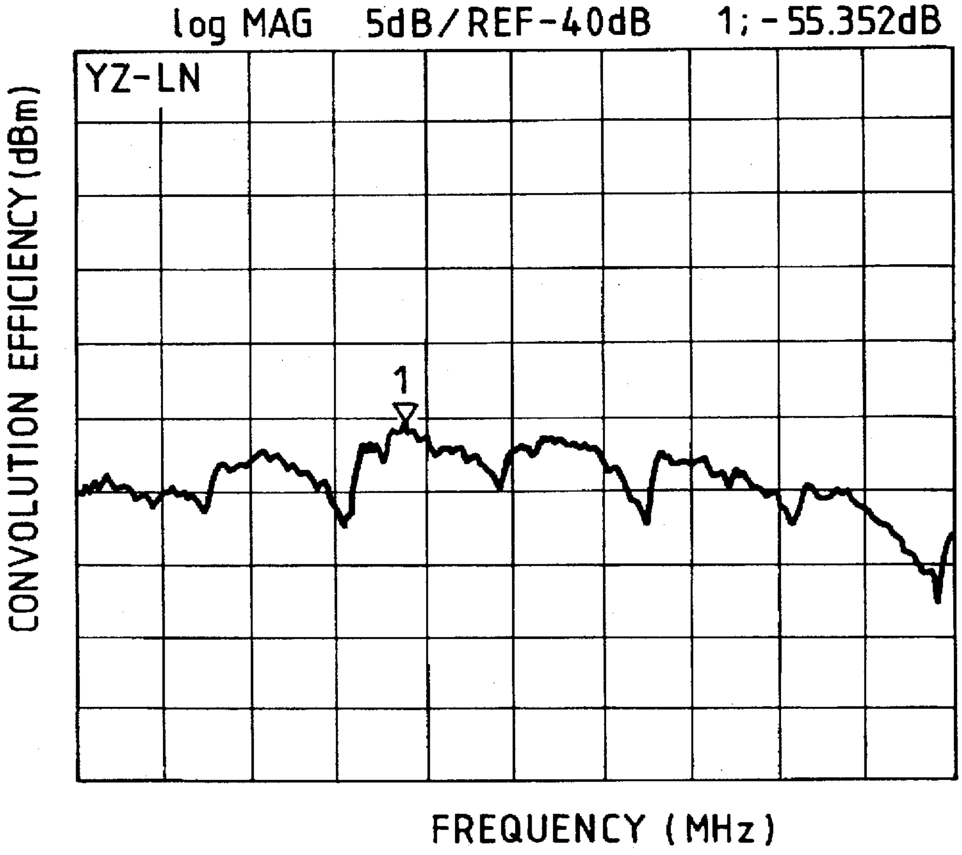
FIG. 2 PRIOR ART
FIG. 2 is a drawing of frequency characteristics of a convolution output signal when the back face of a conventional piezoelectric substrate is mirror-finished.

Comparing with the graph of FIG. 2 in the conventional example where the back face of the piezoelectric substrate is mirror-finished, the graph of FIG. 5 shows that the bulk waves of convolution output on the frequency characteristics are somewhat relaxed, but still have large components to the output signal, influence of which cannot be ignored.

In contrast with it, it is seen from the graph of FIG. 6 that the influence of the bulk waves of convolution output on the frequency characteristics of convolution output signal is greatly suppressed and spurious components in the output signal are attenuated.

The above discussion can be summarized as follows. The surface of the back face of the piezoelectric substrate is ground by an abradant having a specific grit. The specific grit of the abradant used at that time is a grit number obtained from the graph shown in FIG. 4 using the wavelength $\lambda_B$ of the bulk waves of convolution output, or a grit number below the thus obtained grit number. At the same time, the width and depth of the roughness formed at that time need to be at least about the wavelength $\lambda_B$ of the bulk waves, or greater than it, and the maximum width is the length of the output electrode of the SAW convolver.

As a result, the convolver can suppress the bulk waves of convolution output generated from the output electrode of SAW convolver formed on the surface of substrate and can attenuate the spurious components included in the convolution output signal, thereby improving various characteristics including the convolution efficiency and band.

In the above discussion, the values of grit of abradant were those standardized by Japanese Industrial Standard.

FIG. 7 shows a table indicating a relation between grit of abradant and mean diameter of particles, which is partly transcribed from Japanese Industrial Standard JIS R6001. From this table, a relation can also be shown between the mean diameter of particles and the maximum depth of the roughness configuration formed on the back face.

The above embodiment showed an example in which electric signals of the same carrier angular frequency ω were input into the respective interdigital input electrodes of the SAW convolver, but the electric signals do not have to be of the same frequency; for example, electric signals of mutually different carrier angular frequencies can be input into the respective input electrodes, and in that case, an output signal obtained from the output electrode has a frequency of a sum of the two carrier angular frequencies of the input signals.

The grinding method does not have to be limited to that used in the above embodiment, but may be any other grinding method as long as the abradant described in the above discussion is used.

Further, the method for forming the configuration of the back face shown in the above embodiment is not limited to only the grinding method, but may be any other method such as etching.

The piezoelectric substrate 1 shown in the above discussion was of Y-cut (Z-propagation) lithium niobate, but the piezoelectric substrate may be made of another piezoelectric material or a piezoelectric material of another cut direction.

The operating frequency of the SAW convolver shown in the above discussion is just an example, and can be any other frequency.

Further, the SAW device in the above embodiment was exemplified as an elastic type, but it does not originally have to be limited to it; for example, it may be of an AE type.

The piezoelectric substrate shown in the above embodiment may be replaced by a substrate using a piezoelectric body itself or a substrate obtained by forming a piezoelectric substance on a nonpiezoelectric substance. Namely, the substrate may be any substrate as long as it has piezoelectricity and it can excite SAW.

[Embodiment 2]

The second embodiment of the present invention is next explained.

The first embodiment was explained referring to the graph shown in FIG. 4 to verify that the bulk waves of convolution output can be suppressed most efficiently when the maximum depth of the roughness configuration formed on the back face of the piezoelectric substrate is not less than the wavelength of the bulk waves of convolution output taken out of the output electrode, by fixing the input central frequency of the SAW convolver used at a constant value and changing the grit number of abradant for forming the roughness configuration on the back face of the piezoelectric substrate.

Figures 8, 9:
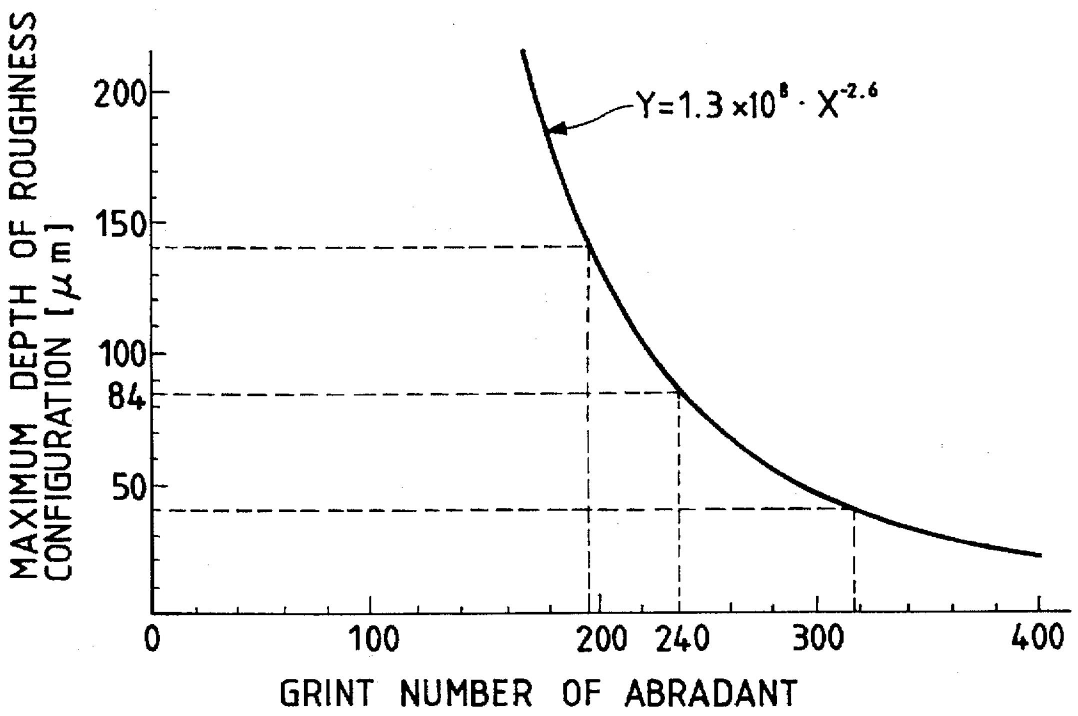
FIG. 8 is a drawing to show a relation between grit number of abradant and maximum depth of roughness configuration of the back face of the piezoelectric substrate.
FIG. 9 is a drawing to show a relation among the grit number of abradant, the convolution output frequency capable of suppressing influence of bulk waves of convolution output, and the input central frequency.

In the next place, the second embodiment will be described from another angle with respect to the graph showing the relation between the grit number of abradant and the maximum depth of the roughness configuration formed thereby on the back face in the present invention, as shown in FIG. 4, and further with respect to the relation with attenuation of the bulk waves of convolution output, inversely by fixing the roughness of the back face of the piezoelectric substrate at one grit number and changing the central frequency of the SAW convolver to some values. FIG. 8 is an enlarged drawing of the vicinity around the grit number of abradant #240 in the graph indicating the relation between the grit number of abradant and the maximum depth of the roughness configuration formed thereby on the back face in the present invention, shown in FIG. 4.

In the drawing, the abscissa represents the grit number of abradant while the ordinate the maximum depth of the roughness configuration.

In the drawing, the relation between the grit number of abradant and the maximum depth of the roughness configuration can be expressed by the following function with the abscissa being X and the ordinate being Y [μm].

$$Y=1.3\times10^{8}\cdot X^{-2.6} \quad (3)$$

Since an attenuation amount of bulk waves of convolution output is related to the depth and width of the roughness configuration formed on the back face of substrate, particularly because it is greatly dependent upon the maximum depth of the roughness configuration among them, the maximum depth of the roughness configuration formed on the back face largely affects the wavelength of the bulk waves of convolution output.

Here, let us assume that the piezoelectric substrate used for the SAW convolver is a Y-cut lithium niobate substrate and that the grit number of the roughness configuration formed on the back face thereof is fixed at #240. Then the maximum depth of the roughness configuration formed on the back face at that time becomes about 84 μm. This value can be replaced by the wavelength of the bulk waves of convolution output, and this value is a maximum value that can suppress influence of the bulk waves of convolution output.

In other words, in case of the wavelength of the bulk waves of convolution output being greater than 84 μm, the influence of the bulk waves of convolution output cannot be suppressed because the state of the roughness configuration formed on the back face looks flat when seen from the bulk waves of convolution output.

Conversely, when the wavelength of the bulk waves of convolution output is smaller than 84 μm, the state of the roughness configuration formed on the back face looks rough when seen from the bulk waves of convolution output. Thus, the bulk waves of convolution output are diffusely reflected by the surface, whereby the influence of the bulk waves of convolution output can be suppressed efficiently.

Namely, it is understood that the maximum depth of the roughness configuration shown on the ordinate of FIG. 8 needs to be equivalent to or more than the wavelength of the bulk waves of convolution output in order to suppress the influence of the bulk waves of convolution output.

FIG. 9 shows a table of maximum depths (=wavelengths of bulk waves of convolution output) of the roughness configuration formed on the back face with values of near the grit number #240 of abradant, frequencies of convolution output at that time, and central frequencies of input signal to the convolver (where electric signals of the same carrier angular frequency are input into the respective interdigital electrodes in the SAW convolver), derived using speeds of the bulk waves of convolution output propagating in the Y-cut lithium niobate substrate and FIG. 8.

For grit numbers of abradant #197, 240, 320, input central frequencies 20, 35, 75 MHz, respectively, are border frequencies that can suppress the influence of the bulk waves of convolution output.

Figure 10:
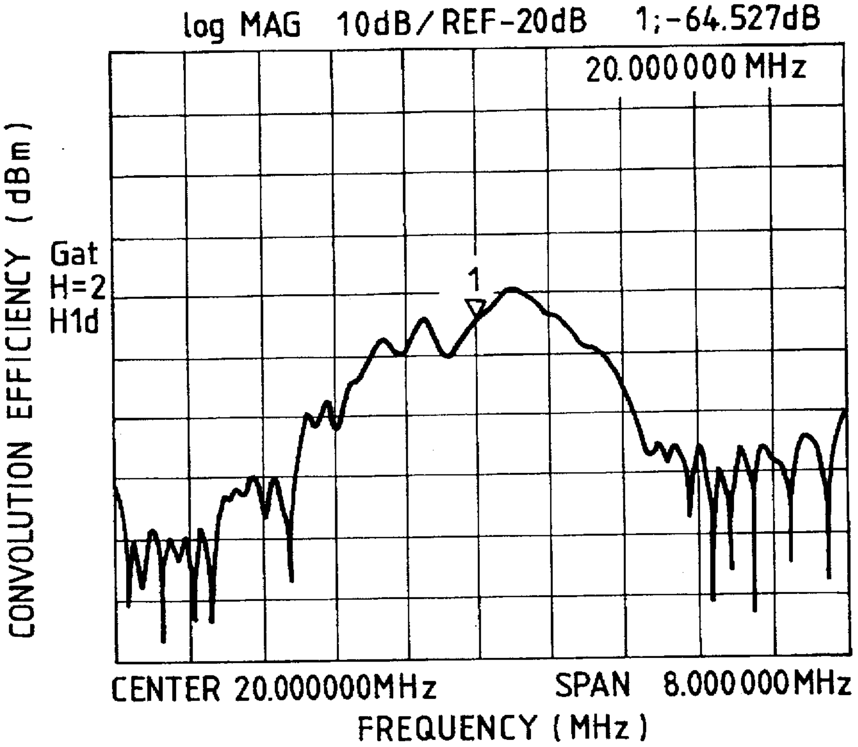
FIG. 10 is a drawing to show frequency characteristics measured of a convolution output signal with the input central frequency 20 MHz of SAW convolver when the back face is ground by the grit number #240 of abradant according to the present invention.
Figure 11:
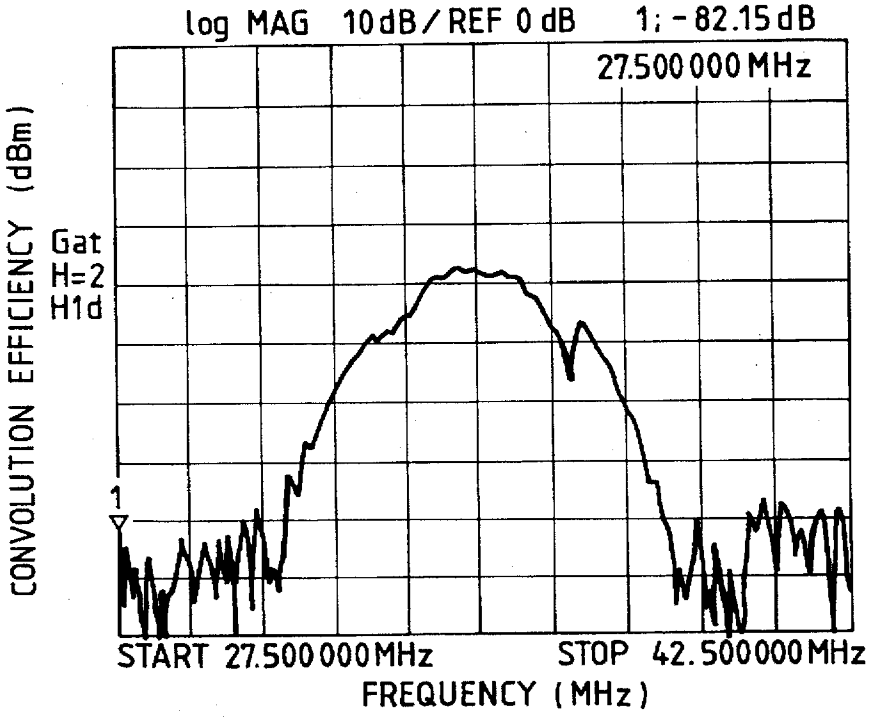
FIG. 11 is a drawing to show frequency characteristics measured of a convolution output signal with the input central frequency 35 MHz of SAW convolver when the back face is ground by the grit number #240 of abradant according to the present invention.
Figure 12:
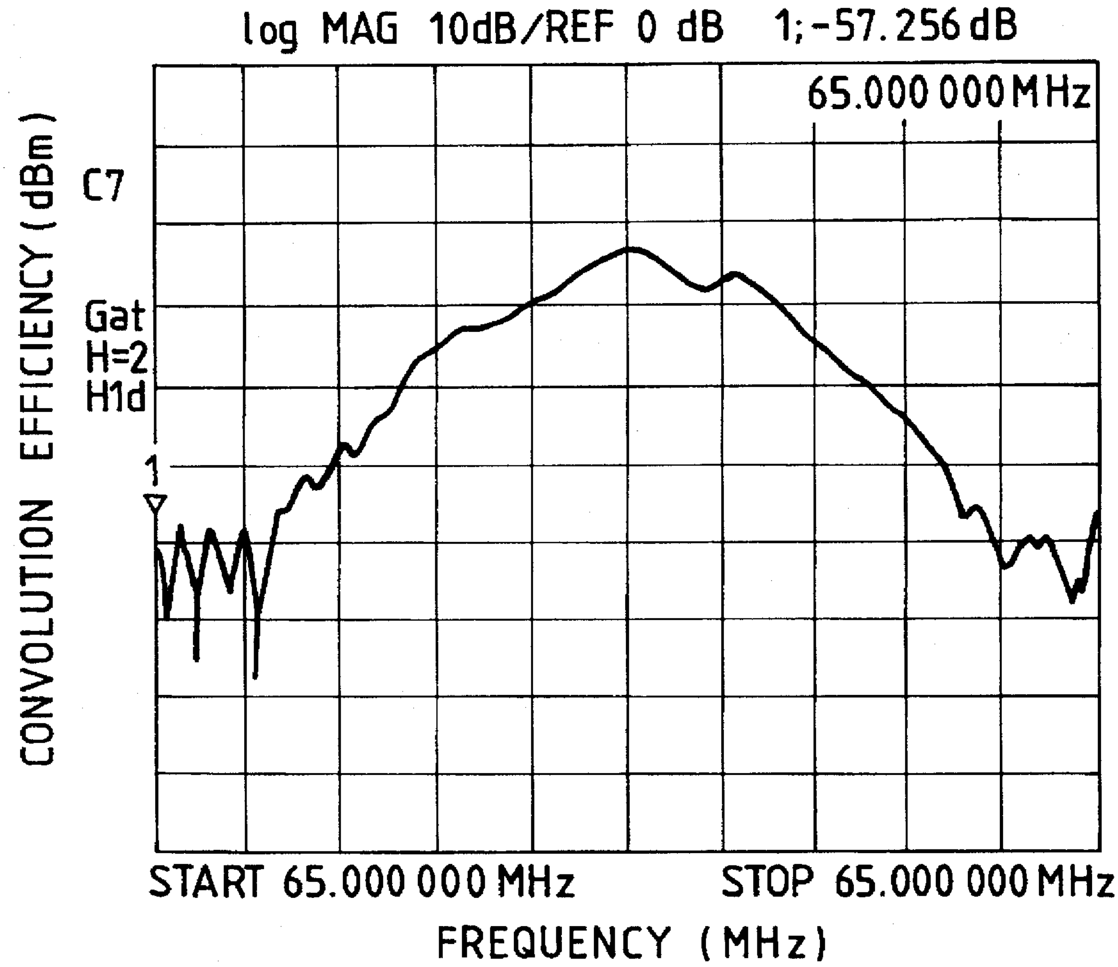
FIG. 12 is a drawing to show frequency characteristics measured of a convolution output signal with the input central frequency 75 MHz of SAW convolver when the back face is ground by the grit number #240 of abradant according to the present invention.

FIG. 10 to FIG. 12 are graphs obtained when the frequency characteristics of convolution output signal of SAW convolver were measured for the central frequencies of input signal of convolver, 20, 35, 75 MHz with the back face of the piezoelectric substrate of the SAW convolver ground by the grit number #240 of abradant.

As seen from FIG. 10, the signal of frequency characteristics includes large ripples and thus is greatly affected by the influence of the bulk waves of convolution output.

In contrast with it, it is seen from FIG. 11 and FIG. 12 that the ripples are well suppressed and the bulk waves of convolution output are greatly attenuated in the frequency characteristics of convolution output, as apparent in comparison with the graph of FIG. 10, because the input central frequencies of SAW convolver are those to keep the wavelengths of the bulk waves of convolution output smaller than the maximum depth by the grit number #240 for the roughness configuration formed on the back face of the piezoelectric substrate. It is also understood that the influence of the bulk waves of convolution output becomes more relaxed as the input central frequency or the convolution output frequency increases.

It is thus concluded that the input central frequency should be further increased in order to effectively suppress the influence of the bulk waves of convolution output.

From the above discussion, it is concluded that by grinding the surface of the back face of the piezoelectric substrate with an abradant having a certain specific grit, the bulk waves of convolution output can be suppressed and the spurious components contained in the convolution output signal can be attenuated when the wavelength of the bulk waves is equal to or greater than the maximum depth of the roughness configuration formed on the back face of the piezoelectric substrate with the abradant. This results in improving various characteristics including the convolution efficiency and band.

In other words, the conditions required are as follows: the surface of the back face of the piezoelectric substrate is ground with an abradant having a certain specific grit; the certain specific grit of the abradant used at that time is equal to or smaller than a grit number obtained using the wavelength $\lambda_B$ of the bulk waves of convolution output from the graph shown in FIG. 4; at the same time, the width and depth of roughness formed at that time are at least equal to or greater than the wavelength $\lambda_B$ of the bulk waves; and the maximum width is the length of the output electrode of the SAW convolver.

As a result, the above arrangement can suppress the bulk waves of convolution output generated from the output electrode of the SAW convolver formed on the surface of substrate and can attenuate the spurious components contained in the convolution output signal, thereby improving the various characteristics such as the convolution efficiency and band.

In the above discussion, the values of grit of abradant were those standardized by Japanese Industrial Standard.

FIG. 7 shows the table indicating the relation between the grit of abradant and the mean diameter of particles, which is partly transcribed from Japanese Industrial Standard JIS R6001. From this table, a relation can also be shown between the mean diameter of particles and the maximum depth of the roughness configuration formed on the back face.

The above embodiment showed an example in which electric signals of the same carrier angular frequency ω were input into the respective interdigital input electrodes of the SAW convolver, but the electric signals do not have to be of the same frequency; for example, electric signals of mutually different carrier angular frequencies can be input into the respective input electrodes, and in that case, an output signal obtained from the output electrode has a frequency of a sum of the two carrier angular frequencies of the input signals.

The grinding method does not have to be limited to that used in the above embodiment, but may be any other grinding method as long as the abradant shown in the above discussion is used.

Further, the method for forming the configuration of the back face shown in the above embodiment is not limited to only the grinding method, but may be any other method such as etching.

The piezoelectric substrate 1 shown in the above discussion was of Y-cut (Z-propagation) lithium niobate, but the piezoelectric substrate may be made of another piezoelectric material or a piezoelectric material of another cut direction.

The operating frequency of the SAW convolver shown in the above discussion is just an example, and can be any other frequency.

The piezoelectric substrate described in the above embodiment may also be any substrate having piezoelectricity, similarly as in Embodiment 1.

[Embodiment 3]

Figure 13:
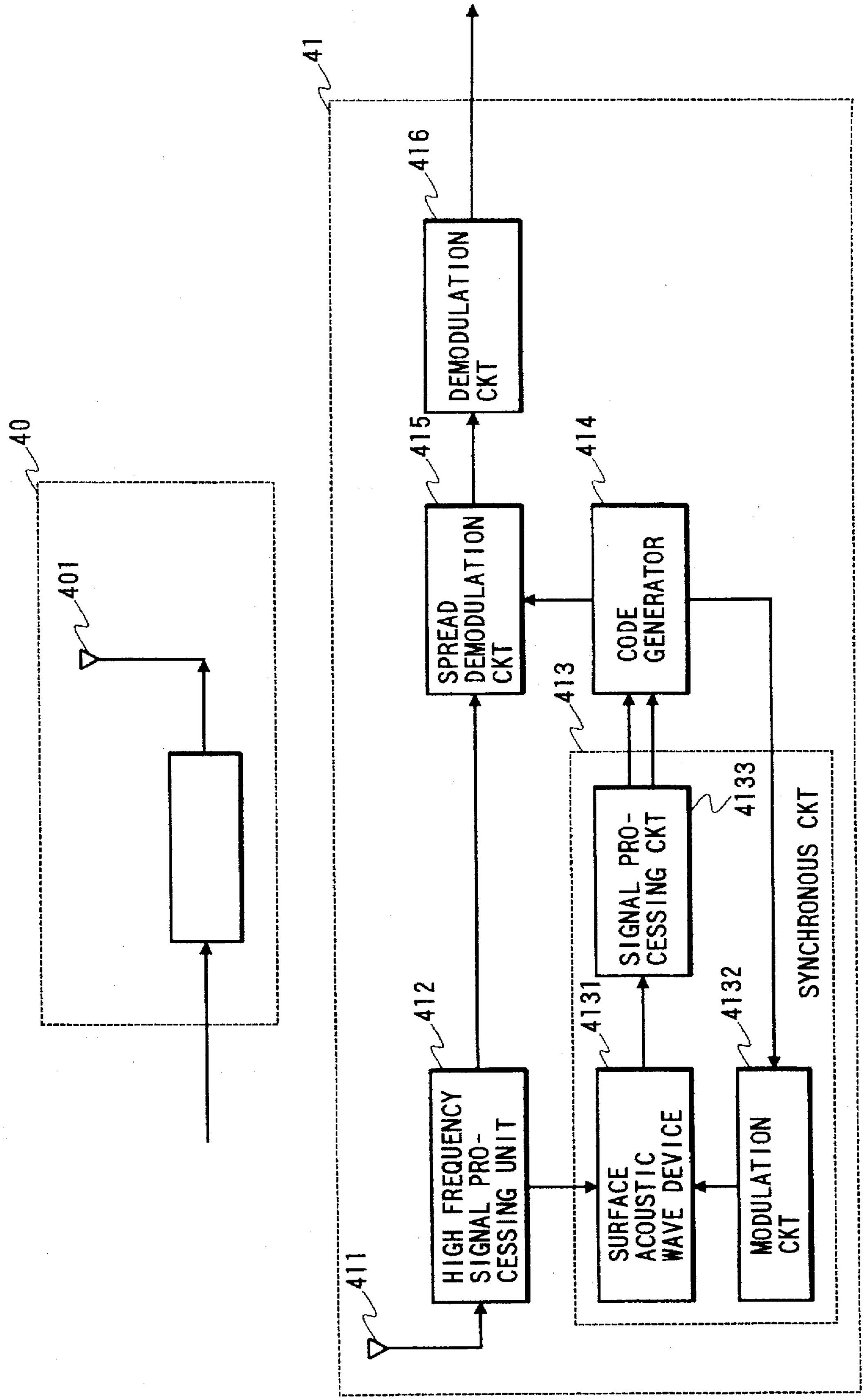
FIG. 13 is a block diagram to show an example of a communication system using the SAW device of the present invention.

FIG. 13 is a block diagram to show an example of a communication system using the SAW device as explained above. In the drawing, reference numeral 40 designates a transmitter. This transmitter modulates a signal to be transmitted by spread spectrum modulation using a spread code, and transmits the spread signal through an antenna 401. The signal transmitted is received by a receiver 41 to be demodulated. The receiver 41 is composed of an antenna 411, a high frequency signal processing unit 412, a synchronous circuit 413, a code generator 414, a spread demodulation circuit 415, and a demodulation circuit 416. The signal received through the antenna 411 is subjected to appropriate filtering and amplification in the high frequency signal processing unit 412 to be output as held as a transmission-frequency-band signal or after converted into an intermediate-frequency-band signal. The signal is put into the synchronous circuit 413. The synchronous circuit 413 is composed of a SAW device 4131 as described in the embodiments of the present invention, a modulation circuit 4132 for modulating a reference spread code coming from the code generator 414, and a signal processing circuit 4133 for processing a signal output from the SAW device 4131 and outputting a spread code synchronizing signal for the transmitted signal, and a clock synchronizing signal to the code generator 414. The SAW device 4131 receives an output signal from the high frequency signal processing unit 412 and an output signal from the modulation circuit 4132 to perform the convolution operation of the two input signals. Here, supposing the reference spread code input from the code generator 414 into the modulation circuit 4132 is a time-inverted code of the spread code transmitted from the transmitter, the SAW device 4131 outputs a correlation peak when a synchronization-purpose-only spread code component included in the received signal and the reference spread code coincide with each other on the waveguide in the SAW device 4131. The signal processing circuit 4133 detects the correlation peak from the signal coming from the SAW device 4131, calculates an amount of deviation of code synchronization from a time between code start of the reference spread code and output of the correlation peak, and outputs the code synchronizing signal and clock signal to the code generator 414. After establishing synchronization, the code generator 414 generates a spread code coincident in clock and spread code phase with the transmitter-side spread code. This spread code is input into the spread demodulation circuit 415, which restores the signal before spread-modulated. The signal output from the spread demodulation circuit 415 is one modulated by a modulation method popularly used, such as so-called frequency modulation or phase modulation, and therefore, data demodulation is carried out by the demodulation circuit well known by those skilled in the art.

[Embodiment 4]

Figure 14:
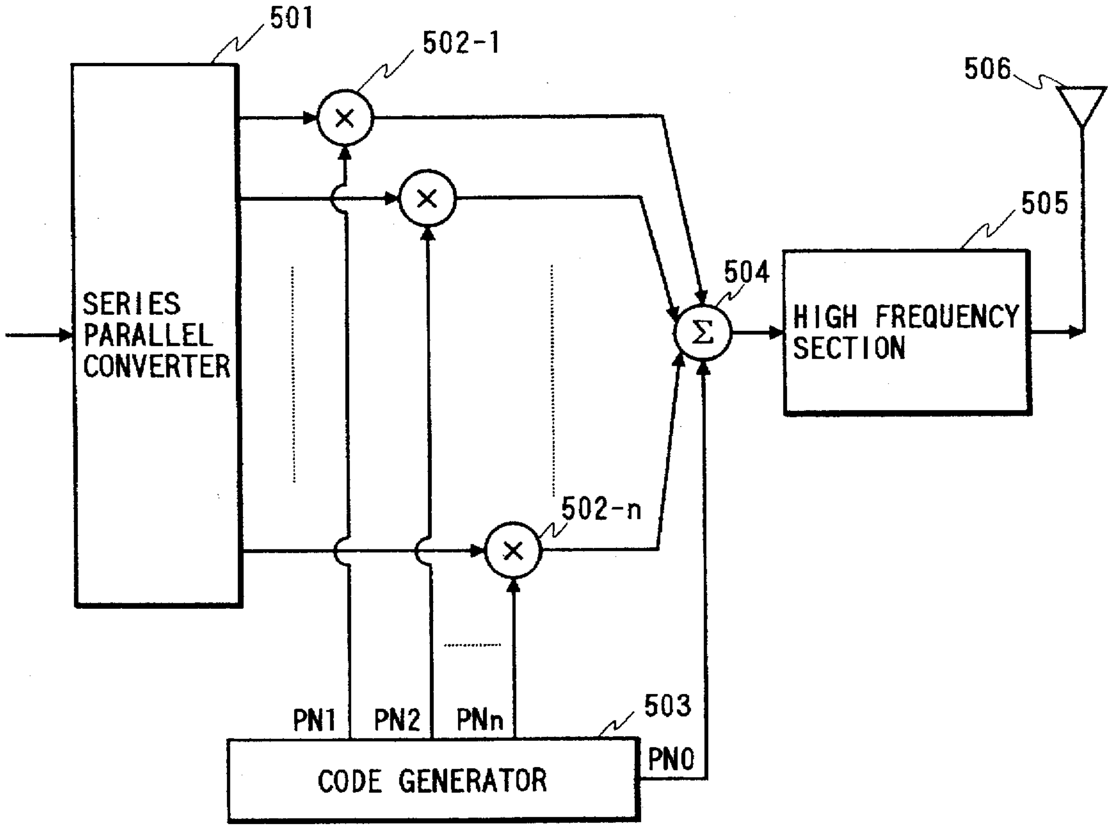
FIG. 14 is a block diagram to show an example of transmitter and receiver in a communication system using the SAW device of the present invention.
Figure 15:
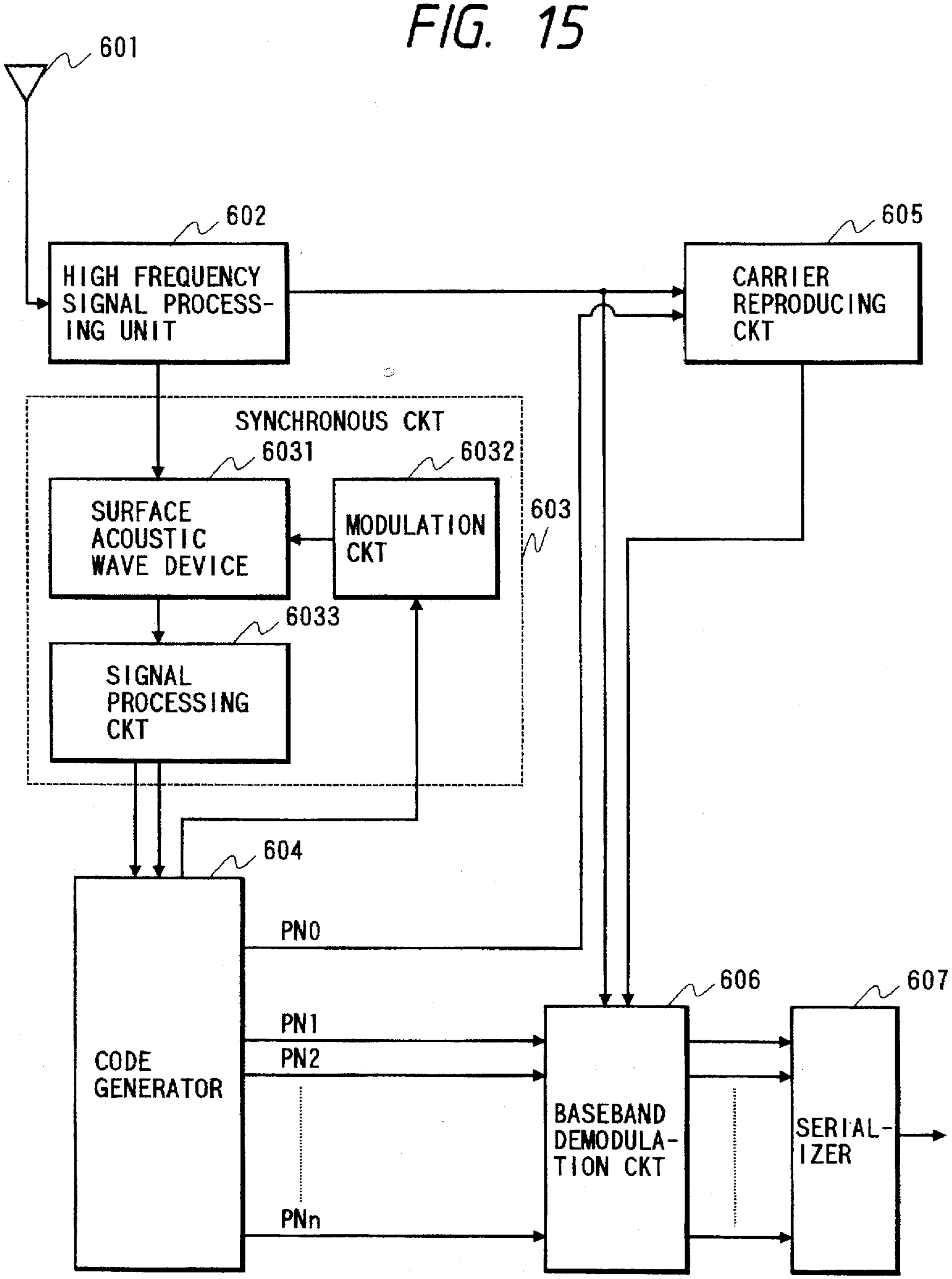
FIG. 15 is a block diagram to show an example of transmitter and receiver in the communication system using the SAW device of the present invention.

FIG. 14 and FIG. 15 are block diagrams to show an example of a transmitter and a receiver in a communication system using the SAW device as explained above. In FIG. 14, reference numeral 501 designates a series-parallel converter for converting data input in parallel into n pieces of serial data, 502-1 to 502-n multipliers for multiplying the thus parallelized data each by n spread codes output from a spread code generator, 503 a spread code generator for generating n mutually different spread codes and a synchronization-purpose-only spread code, 504 an adder for adding the synchronization-purpose-only spread code output from the spread code generator 503 and n outputs from the multipliers 502-1 to 502-n, 505 a high frequency section for converting an output from the adder 504 into a transmission-frequency signal, and 506 a transmission antenna.

Further, in FIG. 15, reference numeral 601 denotes a receiver antenna, 602 a high frequency signal processing unit, 603 a synchronous circuit for capturing and maintaining synchronization between the transmission-side spread code and the clock, 604 a spread code generator for generating (n+1) spread codes, which are the same as the transmission-side spread codes, and a reference spread code, based on the spread synchronization signal and clock signal coming from the synchronous circuit 603, 605 a carrier reproducing circuit for reproducing a carrier signal from a carrier reproduction spread code output from the spread code generator 604 and an output from the high frequency signal processing unit 602, 606 a baseband demodulation circuit for performing demodulation by baseband using the output from the carrier reproducing circuit 605, the output from the high frequency signal processing unit 602, and the n spread codes being outputs from the spread code generator 604, and 607 a serializer (parallel-serial converter) for performing parallel-serial conversion of the n parallel demodulated data being outputs from the baseband demodulation circuit 606.

In the above arrangement, on the transmission side the series-parallel converter 501 first converts input data into n parallel data, where n is equal to a code division multiplex number. On the other hand, the spread code generator 503 generates (n+1) mutually different spread codes PN0–PNn with same code period. Among them PN0 is used only for the purposes of synchronization and carrier reproduction and is input directly into the adder 504 without being modulated by the parallel data. The remaining n spread codes are modulated by the n parallel data in the multipliers 502-1 to 502-n and the modulated codes are put into the adder 504. The adder 504 linearly adds the (n+1) signals input thereinto to output a baseband signal of the sum to the high frequency section 505. The baseband signal is then converted into a high-frequency signal having an appropriate central frequency in the high frequency section 505, and the high-frequency signal is transmitted through the transmitter antenna 506.

On the receiver side, the signal received through the receiver antenna 601 is subjected to appropriate filtering and amplification in the high frequency signal processing unit 602, and is output as held as a transmission-frequency band signal or after converted into a proper intermediate-frequency band signal. The signal is input into the synchronous circuit 603. The synchronous circuit 603 is composed of a SAW device 6031 as described in the embodiments of the present invention, a modulation circuit 6032 for modulating the reference spread code coming from the code generator 604, and a signal processing circuit 6033 for processing the signal output from the SAW device 6031 to output the spread code synchronizating signal for the transmitted signal, and the clock synchronizating signal to the spread code generator 604. The SAW device 6031 receives an output signal from the high frequency signal processing unit 602 and an output signal from the modulation circuit 6032 to execute the convolution operation of the two input signals. Here, supposing the reference spread code input from the code generator 604 into the modulation circuit 6032 is a time-inverted code of the synchronization-purpose-only spread code transmitted from the transmitter, the SAW device 6031 outputs a correlation peak when the synchronization-purpose-only spread code component in the received signal and the reference spread code coincide with each other on the waveguide in the SAW device 6031. The signal processing circuit 6033 detects the correlation peak from the signal coming from the SAW device 6031, calculates an amount of deviation of code synchronization from a time between code start of the reference spread code and output of the correlation peak, and outputs the code synchronizating signal and clock signal to the spread code generator 604. After establishing synchronization, the spread code generator 604 generates spread codes coincident in clock and spread code phase with the transmission-side spread codes. Among these codes the spread code PN0 only for synchronization purpose is input into the carrier reproducing circuit 605. The carrier reproducing circuit 605 performs reverse spread of the received signal in the transmission frequency band or the converted signal in the intermediate frequency band, which is an output from the high frequency signal processing unit 602, to reproduce the carrier wave in the transmission frequency band or the intermediate frequency band. The carrier reproducing circuit 605 is constructed for example of a circuit utilizing a phase lock loop. The received signal and the synchronization-purpose-only spread code PN0 are multiplied together in a multiplier. After synchronization is established, the clocks and code phases of the synchronization-purpose-only spread code in the received signal and the synchronization-purpose-only spread code for reference are coincident with each other, and the transmission-side synchronization-purpose-only spread code is not modulated by data and is reversely spread by the multiplier. Thus, the carrier component appears in an output from the multiplier. The output is then input into a band-pass filter to extract only the carrier component. The carrier component thus extracted is then output. The output is then input into a well known phase lock loop composed of a phase detector, a loop filter, and a voltage controlled oscillator, and the voltage controlled oscillator outputs a reproduced carrier wave, which is a signal locked in phase to the carrier component output from the band-pass filter. The carrier wave reproduced is input into the baseband demodulation circuit 606. The baseband demodulation circuit produces a baseband signal from the reproduced carrier wave and the output from the high frequency signal processing unit 602. The baseband signal is distributed into n pieces, which are reversely spread in code division channels with spread codes PN1–PNn as being outputs from the spread code generator 604. Then data demodulation is carried out. The n pieces of parallel demodulation data thus demodulated are converted into serial data in the serializer 607, and the serial data is output.

The present embodiment is an example of binary modulation, but any other modulation method, such as quadrature modulation, may be employed.

As described above, the present invention clearly showed the relation between the wavelength of the bulk waves of convolution output and the roughness configuration of the back face of the piezoelectric substrate, derived from the central frequency of the interdigital input electrodes used in the SAW convolver device, whereby the bulk waves of convolution output included in the convolution output signal taken out of the output electrode can be suppressed easily, surely, and efficiently and whereby the influence of the nonlinear bulk waves can be eliminated, thereby achieving the SAW device capable of obtaining the convolution output signal without spurious component with good reproducibility.

Further, the present invention also clarified the relation between the maximum depth of the roughness configuration on the back face of substrate and the grit number of abradant for obtaining it, whereby the influence of the bulk waves can be eliminated easily, surely, and with good reproducibility by grinding the back face with an abradant of a specific grit number, thus achieving the effect to produce the SAW device capable of obtaining the convolution output signal without spurious component.

Namely, an optimal roughness configuration can be easily and surely obtained, because the optimal values of the roughness configuration can be obtained without producing them by the conventional trial-and-error method.

What is claimed is:

1. A surface acoustic wave device, comprising:

a substrate having piezoelectricity;

at least two input electrodes, provided on said substrate, for exciting first and second surface acoustic waves; and an output electrode for taking a convolution signal of said two surface acoustic waves out;

wherein said substrate has a roughness configuration on a back face thereof and a maximum depth of said roughness configuration is not less than a wavelength of bulk waves of convolution output taken out of said output electrode.

2. A surface acoustic wave device according to claim 1, wherein a width of said roughness configuration is not less than the wavelength of said bulk waves of convolution output and not more than a length of said output electrode.

3. A surface acoustic wave device according to claim 1, wherein Y-cut lithium niobate is used for said substrate having piezoelectricity.

4. A surface acoustic wave device, comprising:

a substrate having piezoelectricity;

at least two input electrodes, provided on said substrate, for exciting first and second surface acoustic waves; and an output electrode for taking a convolution signal of said two surface acoustic waves out;

wherein said substrate has a roughness configuration on a back face thereof and said roughness configuration is formed by grinding said back face with an abradant of a grit number N satisfying the following relation:

$$N \leqq \sqrt[2.6]{\frac{1.3 \times 10^8}{\lambda_B}}$$

where $\lambda_B$ is a wavelength of bulk waves of convolution output taken out of said output electrode.

5. A surface acoustic wave device according to claim 4, wherein a width of said roughness configuration is not less than the wavelength of said bulk waves of convolution output and not more than a length of said output electrode.

6. A surface acoustic wave device according to claim 4, wherein Y-cut lithium niobate is used for said substrate having piezoelectricity.

7. A method for producing a surface acoustic wave device which comprises:

a substrate having piezoelectricity;

at least two input electrodes, provided on said substrate, for exciting first and second surface acoustic waves; and an output electrode for taking a convolution signal of said two surface acoustic waves out;

said method having a step of forming a roughness configuration on a back face of said substrate so that a maximum depth of the roughness configuration is not less than a wavelength of bulk waves of convolution output taken out of said output electrode.

8. A method for producing a surface acoustic wave device which comprises:

a substrate having piezoelectricity;

at least two input electrodes, provided on said substrate, for exciting first and second surface acoustic waves; and an output electrode for taking a convolution signal of said two surface acoustic waves out;

said method having a step of grinding a back face of said substrate with an abradant, wherein said grinding is carried out using the abradant of a grit number N satisfying the following relation:

$$N \leqq \sqrt[2.6]{\frac{1.3 \times 10^8}{\lambda_B}}$$

where $\lambda_B$ is a wavelength of bulk waves of convolution output taken out of said output electrode.

9. A receiver for receiving a spread spectrum signal, comprising a surface acoustic wave device for obtaining a correlation output between a spread code signal and a reference spread code signal input thereinto, said surface acoustic wave device comprising:

a substrate having piezoelectricity;

at least two input electrodes, provided on said substrate, for exciting first and second surface acoustic waves; and an output electrode for taking a convolution signal of said two surface acoustic waves out;

wherein said substrate has a roughness configuration on a back face thereof and a maximum depth of said roughness configuration is not less than a wavelength of bulk waves of convolution output taken out of said output electrode.

10. A receiver for receiving a spread spectrum signal, comprising a surface acoustic wave device for obtaining a correlation output between a spread code signal and a reference spread code signal input thereinto, said surface acoustic wave device comprising:

a substrate having piezoelectricity;

at least two input electrodes, provided on said substrate, for exciting first and second surface acoustic waves; and an output electrode for taking a convolution signal of said two surface acoustic waves out;

wherein said substrate has a roughness configuration on a back face thereof and said roughness configuration is formed by grinding said back face with an abradant of a grit number N satisfying the following relation:

$$N \leqq \sqrt[2.6]{\frac{1.3 \times 10^8}{\lambda_B}}$$

where $\lambda_B$ is a wavelength of bulk waves of convolution output taken out of said output electrode.

11. A communication system for communication using a spread spectrum signal, comprising:

a transmitter for spectrum-spreading a signal to be transmitted and outputting the spread signal; and a receiver for receiving the spread spectrum signal, said receiver comprising a surface acoustic wave device for obtaining a correlation output between a spread code signal and a reference spread code signal input thereinto, said surface acoustic wave device comprising:

a substrate having piezoelectricity;

at least two input electrodes, provided on said substrate, for exciting first and second surface acoustic waves; and an output electrode for taking a convolution signal of said two surface acoustic waves out;

wherein said substrate has a roughness configuration on a back face thereof and a maximum depth of said roughness configuration is not less than a wavelength of bulk waves of convolution output taken out of said output electrode.

12. A communication system for communication using a spread spectrum signal, comprising:

a transmitter for spectrum-spreading a signal to be transmitted and outputting the spread signal; and a receiver for receiving the spread spectrum signal, said receiver comprising a surface acoustic wave device for obtaining a correlation output between a spread code signal and a reference spread code signal input thereinto, said surface acoustic wave device comprising:

a substrate having piezoelectricity;

at least two input electrodes, provided on said substrate, for exciting first and second surface acoustic waves; and an output electrode for taking a convolution signal of said two surface acoustic waves out;

wherein said substrate has a roughness configuration on a back face thereof and said roughness configuration is formed by grinding said back face with an abradant of a grit number N satisfying the following relation:

$$N \leqq \sqrt[2.6]{\frac{1.3 \times 10^8}{\lambda_B}}$$

where $\lambda_B$ is a wavelength of bulk waves of convolution output taken out of said output electrode.

13. A surface acoustic wave device according to claim 1, wherein said roughness configuration is formed by grinding.

* * * * *